(12) United States Patent
Kim et al.

(10) Patent No.: US 8,806,240 B2
(45) Date of Patent: Aug. 12, 2014

(54) BATTERY MANAGEMENT SYSTEM, METHOD OF CONTROLLING THE SAME, AND ENERGY STORAGE SYSTEM INCLUDING THE BATTERY MANAGEMENT SYSTEM

(75) Inventors: Seong-Joong Kim, Yongin-si (KR); Joon-Woo Song, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 656 days.

(21) Appl. No.: 13/041,289

(22) Filed: Mar. 4, 2011

(65) Prior Publication Data

US 2011/0296218 A1 Dec. 1, 2011

(30) Foreign Application Priority Data

May 31, 2010 (KR) .................. 10-2010-0051439

(51) Int. Cl.
*G06F 1/26* (2006.01)
*G06F 1/18* (2006.01)
*G06F 1/32* (2006.01)
*H02J 7/00* (2006.01)
*H02J 9/04* (2006.01)

(52) U.S. Cl.
USPC ........... 713/310; 713/300; 713/320; 713/323; 713/324; 320/127; 320/128; 320/135

(58) Field of Classification Search
None
See application file for complete search history.

(56) References Cited

U.S. PATENT DOCUMENTS

| 5,717,937 | A | * | 2/1998 | Fritz | ............................. 713/300 |
| 5,864,221 | A | | 1/1999 | Downs et al. | |
| 2004/0189259 | A1 | * | 9/2004 | Miura et al. | .................. 320/134 |
| 2007/0029972 | A1 | | 2/2007 | Lampe-Onnerud et al. | |
| 2009/0295335 | A1 | | 12/2009 | Yang et al. | |
| 2011/0296218 | A1 | * | 12/2011 | Kim et al. | ..................... 713/323 |

FOREIGN PATENT DOCUMENTS

| JP | 2006-121405 | 5/2006 |
| JP | 2008-118855 | 5/2008 |
| JP | 2010-003536 | 1/2010 |
| KR | 10-2007-0103897 A | 10/2007 |
| KR | 1020070105220 A | 10/2007 |
| KR | 10-2008-0036591 | 4/2008 |
| KR | 10-2009-0126098 A | 12/2009 |

* cited by examiner

*Primary Examiner* — Tanh Nguyen
(74) *Attorney, Agent, or Firm* — Christie, Parker & Hale, LLP (57) ABSTRACT

A battery management system (BMS), a method of controlling the same, and an energy storage system including the battery management system. The BMS may reduce costs by stably supplying power to an insulating unit in a power-saving mode even when an isolator has no built-in direct current (DC)-DC converter.

8 Claims, 6 Drawing Sheets

BATTERY MANAGEMENT SYSTEM, METHOD OF CONTROLLING THE SAME, AND ENERGY STORAGE SYSTEM INCLUDING THE BATTERY MANAGEMENT SYSTEM

CROSS-REFERENCE TO RELATED APPLICATION

This application claims priority to and the benefit of Korean Patent Application No. 10-2010-0051439, filed on May 31, 2010, in the Korean Intellectual Property Office, the entire content of which is incorporated herein in its entirety by reference.

BACKGROUND

1. Field

One or more embodiments of the present invention relate to a battery management system (BMS), a method of controlling the same, and an energy storage system including the BMS.

2. Description of the Related Art

Rechargeable batteries have been used as primary energy storage devices for portable electronic devices, such as cellular phones, laptop computers, camcorders, and personal digital assistants (PDAs), etc. There are various types of rechargeable batteries such as nickel-cadmium batteries, lead storage batteries, nickel metal hydride (NiMH) batteries, lithium-ion batteries, lithium polymer batteries, lithium-metal batteries, and zinc-air storage batteries. Such rechargeable batteries are combined with circuits to constitute a battery pack, and are charged and discharged through an external terminal of the battery pack.

A conventional battery pack typically includes a battery cell, and a peripheral circuit including a charge/discharge circuit. The peripheral circuit is formed as a printed circuit board and is combined with the battery cell. When an external power source is coupled to the battery pack through an external terminal of the battery pack, the battery cell is charged by the external power source through the external terminal and the charge/discharge circuit, and when a load is coupled to the battery pack through the external terminal, the battery cell supplies power to the load through the external terminal and the charge/discharge circuit. The charge/discharge circuit is located between the external terminal and the battery cell and controls charging and discharging of the battery cell.

SUMMARY

Aspects of one or more embodiments of the present invention are directed toward an analog front end integrated circuit (IC) of a battery management system (BMS) to supply power to an isolator.

Aspects of one or more embodiments of the present invention are directed toward a BMS that can stably supply power to an insulating unit in a power-saving mode even when an isolator has no built-in direct current (DC)-DC converter.

Aspects of one or more embodiments of the present invention are directed toward a method of controlling a BMS that can stably supply power to an insulating unit in a power-saving mode even when an isolator has no built-in DC-DC converter.

Aspects of one or more embodiments of the present invention are directed toward an energy storage system including a BMS that can stably supply power to an insulating unit in a power-saving mode even when an isolator has no built-in DC-DC converter.

Additional aspects will be set forth in part in the description which follows and, in part, will be apparent from the description, or may be learned by practice of the presented embodiments.

According to one or more embodiments of the present invention, a battery management system includes: a battery cell; an analog front end coupled to a first ground; a computer coupled to a second ground; an insulating unit for insulating the analog front end from the computer; and a first power switching unit for receiving a control signal from the computer through the insulating unit, distributing power of the battery cell according to the control signal, and supplying the distributed power to the insulating unit.

The analog front end may be configured to receive the control signal corresponding to a power-saving mode from the computer through the insulating unit, and turn off a first power supply unit of the analog front end.

The first power switching unit may further include: a transistor configured to be turn on or off according to the control signal; and a first resistor and a second resistor coupled to a first terminal of the transistor for distributing a voltage of the battery cell.

The battery management system may further include a diode coupled between the first power supply unit and the insulating unit.

The battery management system may further include a third resistor coupled between a second terminal of the transistor and an output terminal of the insulating unit through which the control signal is output.

In response to receiving the control signal corresponding to a power-saving mode from the computer, the insulating unit may be configured to output the control signal to the analog front end and the first power switching unit. In response to receiving the control signal, the analog front end may be configured to turn off the first power supply unit in the analog front end. In response to receiving the control signal, the first power switching unit may be configured to turn on to supply power of the battery cell distributed through the first resistor and the second resistor to the insulating unit.

The power-saving mode may include a power-down mode or a shut-down mode.

In response to receiving the control signal corresponding to a normal mode from the computer, the insulating unit may be configured to output the control signal to the analog front end and the first power switching unit. In response to receiving the control signal, the analog front end IC may be configured to turn on the first power supply unit in the analog front end, and supply first power to the insulating unit through the first power supply unit. In response to receiving the control signal, the first power switching unit may be configured to turn off to stop supply of power of the battery cell to the insulating unit.

The analog front end IC may be changed to the power-saving mode according to the control signal.

The insulating unit may be configured to receive first power from the analog front end, and receive second power from the computer.

According to one or more embodiments of the present invention, an energy storage system for converting power generated by a photovoltaic power generation system and supplying the converted power to a grid or a load, or storing the converted power in a battery; supplying power supplied from the grid to the load or converting the supplied power and storing the converted power in the battery; and converting power stored in the battery and supplying the converted power to the grid or the load; the energy system including a battery management system for controlling charging and discharging of the battery. The battery management system includes: an analog front end for sensing battery information including a voltage, a current, and/or a temperature of the battery; a computer for controlling charging and discharging of the battery based on the battery information; an insulating unit for insulating the analog front end coupled to a first ground from the computer coupled to a second ground, and respectively receiving first power from the analog front end IC and second power from the computer; and a first power switching unit for switching power of the battery according to a power-saving control signal output from the computer through the insulating unit and supplying the power of the battery to the insulating unit.

The analog front end may be configured to receive the control signal corresponding to a power-saving mode from the computer through the insulating unit, and turn off a first power supply unit of the analog front end.

The first power switching unit may include: a transistor configured to turn on or off according to the control signal; and a first resistor and a second resistor coupled to a first terminal of the transistor and designed to distribute a voltage of the battery.

According to one or more embodiments of the present invention, a method of controlling a battery management system including at least one battery cell, an analog front end, a computer, and an insulating unit for insulating the analog front end coupled to a first ground from the computer coupled to a second ground. The method includes: receiving a control signal from the computer through the insulating unit; determining an operation mode of the analog front end according to the power-saving control signal; and supplying a first power and/or a second power to the insulating unit according to the determined operation mode.

If the operation mode is a power-saving mode, the supplying of the first power and/or the second power may include switching power of the battery cell, and supplying the first power obtained by distributing the power of the battery cell to the insulating unit and supplying the second power from the computer to the insulating unit.

The power-saving mode may include a power-down mode or a shut-down mode.

When the operation mode is a power-saving mode, the method may further include changing the analog front end to the power-saving mode.

When the operation mode is a normal mode, the supplying of the first power and/or the second power may include supplying the first power to the insulating unit from a power supply unit included in the analog front end, and supplying the second power to the insulating unit from the computer.

BRIEF DESCRIPTION OF THE DRAWINGS

These and/or other aspects of the present invention will become apparent and more readily appreciated from the following description of the embodiments, taken in conjunction with the accompanying drawings of which.

DETAILED DESCRIPTION

Hereinafter, exemplary embodiments of the present invention will be explained in detail with reference to the attached drawings. In the following description of the present invention, only essential parts necessary to understand operation of the present invention will be explained, and other parts will not be explained when it is deemed that they may unnecessarily obscure the subject matter of the invention.

Also, the meaning of the terms used in the specification and the appended claims should not be construed as being confined to common or dictionary meaning, but they should be construed as concepts not departing from the spirit and scope of the present invention in order to describe the present invention in an appropriate way.

Figure 1:
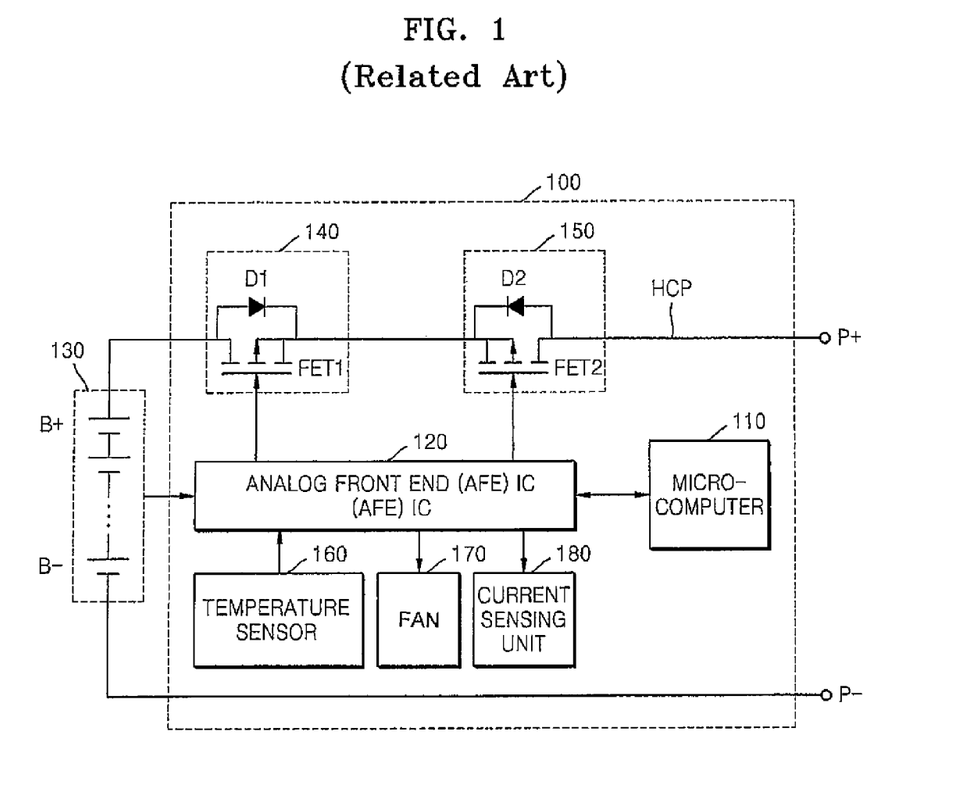
FIG. 1 is a circuit diagram of a conventional battery management system (BMS)

FIG. 1 is a circuit diagram of a comparable battery management system (BMS) 100.

Referring to FIG. 1, the comparable BMS 100 is coupled to a rechargeable battery cell 130, and the BMS 100 includes a protection circuit and controls charging and discharging of the battery cell 130.

External terminals of the BMS 100 are coupled to the battery cell 130 in parallel, and a charging element 140 and a discharging element 150 are coupled in series to a high current path (HCP) between the battery cell 130 and the external terminals.

The BMS 100 includes an analog front end (AFE) integrated circuit (IC) 120 connected in parallel to the battery cell 130, the charging element 140, the discharging element 150, and a microcomputer 110, a temperature sensor 160, a fan 170, and a current sensing unit 180 which are coupled to the AFE IC 120.

If it is determined that the battery cell 130 is in an overcharge or overdischarge state, the microcomputer 110 transmits a corresponding charge or discharge control signal to the AFE IC 120, and the AFE IC 120 turns off the charging element 140 or the discharging element 150 to stop overcharging or overdischarging. That is, if it is determined that the battery cell 130 is in an overcharge or overdischarge state, the microcomputer 110 outputs a corresponding control signal to turn off the charging element 140 or the discharging element 150.

The AFE IC 120 receives information about the battery cell 130 such as a temperature of the battery cell 130, a charge voltage of the battery cell 130, and an amount of current flowing through the battery cell 130.

The charging element 140 and the discharging element 150 respectively perform charging and discharging of the battery cell 130 by being coupled in series on the HCP between the external terminals and the battery cell 130. Each of the charging element 140 and the discharging element 150 may include a field effect transistor (TFT).

The AFE IC 120 is coupled in parallel between the battery cell 130 and the charging element 140 and the discharging element 150, and is coupled in series between the battery cell 130 and the microcomputer 110. The AFE IC 120 detects a voltage of the battery cell 130, transmits the detected voltage to the microcomputer 110, and controls operations of the charging element 140 and the discharging element 150 under the control of the microcomputer 110.

Also, the AFE IC 120 may include a plurality of functional blocks including a block for sensing a voltage, a temperature, and a current of the battery cell 130, a block for achieving cell balancing among a plurality of the battery cells 130, a block for supplying power to the AFE IC 120, and a block for driving the FAN 170.

In one embodiment, the microcomputer 110, which may be an integrated circuit coupled in series between the AFE IC 120 and an external system, prevents or protects from overcharge, overdischarge, and overcurrent of the battery cell 130 by controlling the charging element 140 and the discharging element 150 by using the AFE IC 120. In one embodiment, the microcomputer 110 prevents overcharge and overdischarge of the battery cell 130 by comparing a voltage of the battery cell 130 received through the AFE IC 120 from the battery cell 130 with a preset voltage, and outputting a control signal corresponding to a result of the comparison to the AFE IC 120 to turn on or off the charging element 140 and the discharging element 150.

Also, the microcomputer 110 monitors a state of charge (SOC) and a state of health (SOH) of the battery cell 130; receives battery information, for example, information about a voltage, a current, and a temperature of the battery cell 130, output from the AFE IC 120; analyzes the battery information; and transmits a cell balancing control signal, a power-saving control signal, a charge discharge control signal, and/or a FAN control signal to the AFE IC 120.

Figure 2:
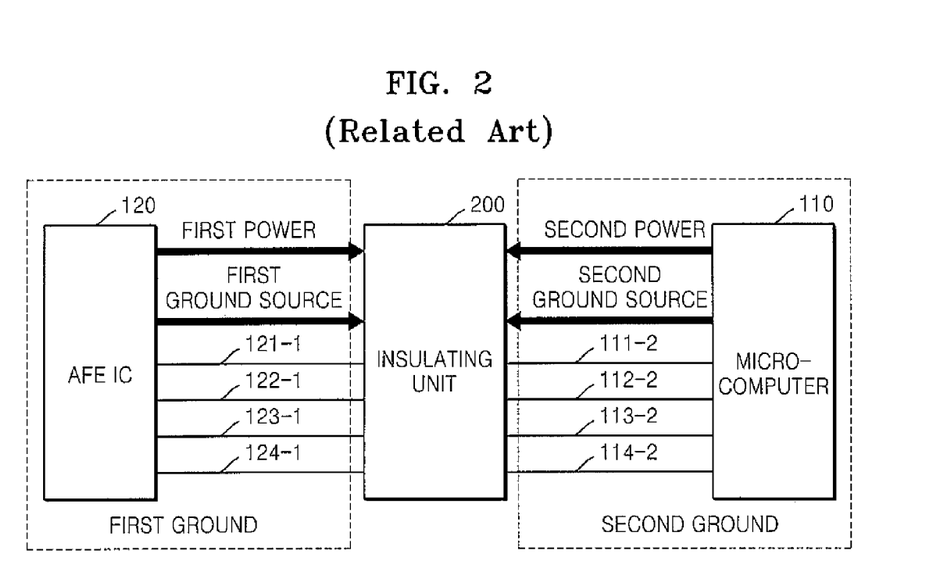
FIG. 2 is a schematic view for explaining a supply of power in the conventional BMS of FIG. 1.

As described above, since a plurality of control signals are input and output between the AFE IC 120 and the microcomputer 110, the AFE IC 120 and the microcomputer 110 are insulated (e.g., isolated) from each other by an insulating unit 200 illustrated in FIG. 2 for the purpose of stable battery control. Here, the term "insulate" means that there is no common ground for a communication circuit between the AFE IC 120 and the microcomputer 110. If the AFE. IC 120 and the microcomputer 110 are not insulated from each other, a difference between control signal levels inevitably occurs, thereby leading to erroneous data transfer and significantly degrading the safety of a battery.

Referring to FIG. 2, the AFE IC 120, the insulating unit 200, and the microcomputer 110 are illustrated. Here, the insulating unit 200 insulates the AFE IC 120, which is coupled to a first ground, from the microcomputer 110, which is coupled to a second ground. The insulating unit 200 receives first power from the AFE IC 120 and receives second power from the microcomputer 110. The first power and the second power may be different. For example, the first power and the second power may be respectively 3 V DC and 5 V DC. The insulating unit 200 communicates with the AFE IC 120 through control signal lines 121-1 through 124-1 and communicates with the microcomputer 110 through control signal lines 111-2 through 114-2. For example, if the BMS 100 is not performing any operations, in order for the BMS 100 to change to a power-saving mode, the microcomputer 110 outputs a power saving signal through the control signal line 111-2 to the insulating unit 200, and the insulating unit 200 processes the power-saving control signal and transmits the processed power-saving control signal through the control signal line 121-1 to the AFE IC 120. Here, the power-saving control signal may be a power-down or a shut-down signal. In response to receiving the power-saving control signal, the AFE IC 120 turns off the block for supplying power to the AFE IC 120 to change to the power-saving mode. Here, a power supply unit inside the AFE IC 120 may not supply the first power to the insulating unit 200. Accordingly, a wakeup signal may be received from the microcomputer 110 to control the AFE IC 120 in the power-saving mode to resume normal operation. In this case, although a direct current (DC)-DC converter may be embedded in the insulating unit 200 to convert the second power supplied from the microcomputer 110 into the first power as in a comparable method, since an isolator including the built-in DC-DC converter has to be included in the insulating unit, cost is increased.

Figure 3:
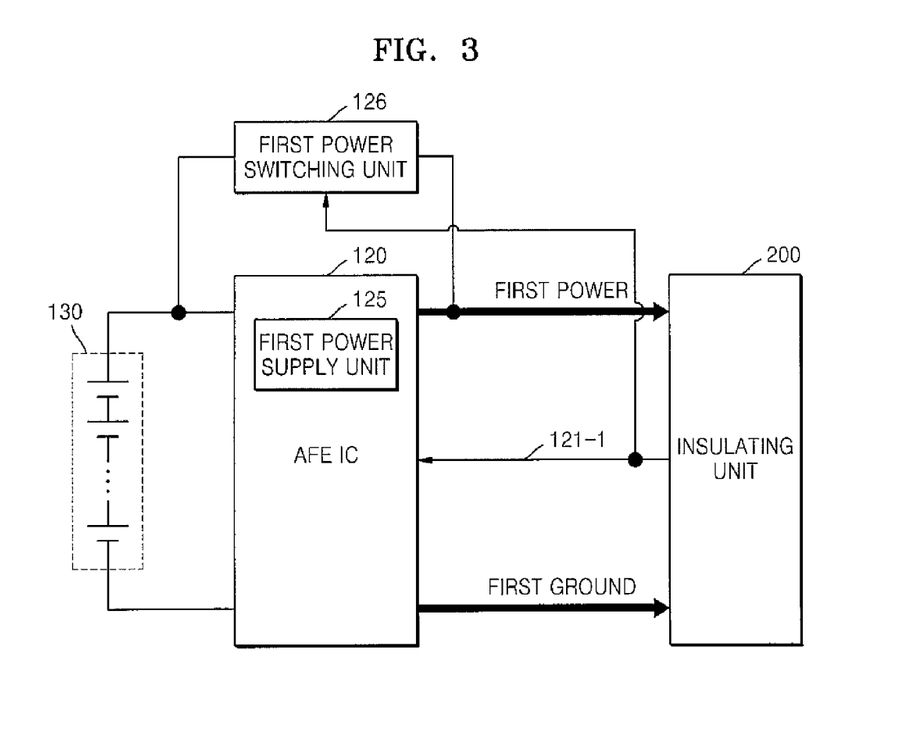
FIG. 3 is a circuit diagram for explaining a BMS according to an embodiment of the present invention.

FIG. 3 is a circuit diagram for explaining a BMS according to an embodiment of the present invention.

Referring to FIG. 3, the BMS includes the AFE IC 120 including a first power supply unit 125, the insulating unit 200, a first power switching unit 126, and the BMS is coupled to the battery cell 130.

The first power switching unit 126 is coupled in parallel to the AFE IC 120, and is coupled between a positive terminal of the battery cell 130 and a first power supply terminal of the AFE IC 120, which is coupled to the insulating unit 200. The first power switching unit 126 performs switching in response to a power-saving control signal output through the control signal line 121-1 from the insulating unit 200. Accordingly, if the first power switching unit 126 is turned on, power of the battery cell 130 is supplied to the insulating unit 200. In more detail, if the BMS enters a power-saving mode, the microcomputer 110 transmits a power-saving control signal to the insulating unit 200. The insulating unit 200 outputs the power-saving control signal through the control signal line 121-1 to the AFE IC 120 and the first power switching unit 126. The AFE IC 120 is changed to the power-saving mode according to the input power-saving control signal and turns off the first power supply unit 125 inside the AFE IC 120.

The first power switching unit 126 is turned on in response to the power-saving control signal and supplies power of the battery cell 130 to the insulating unit 200. Accordingly, although power is not supplied as first power supplied by the AFE IC 120, power may be continuously supplied to the insulating unit 200 through the first power switching unit 126.

Figure 4:
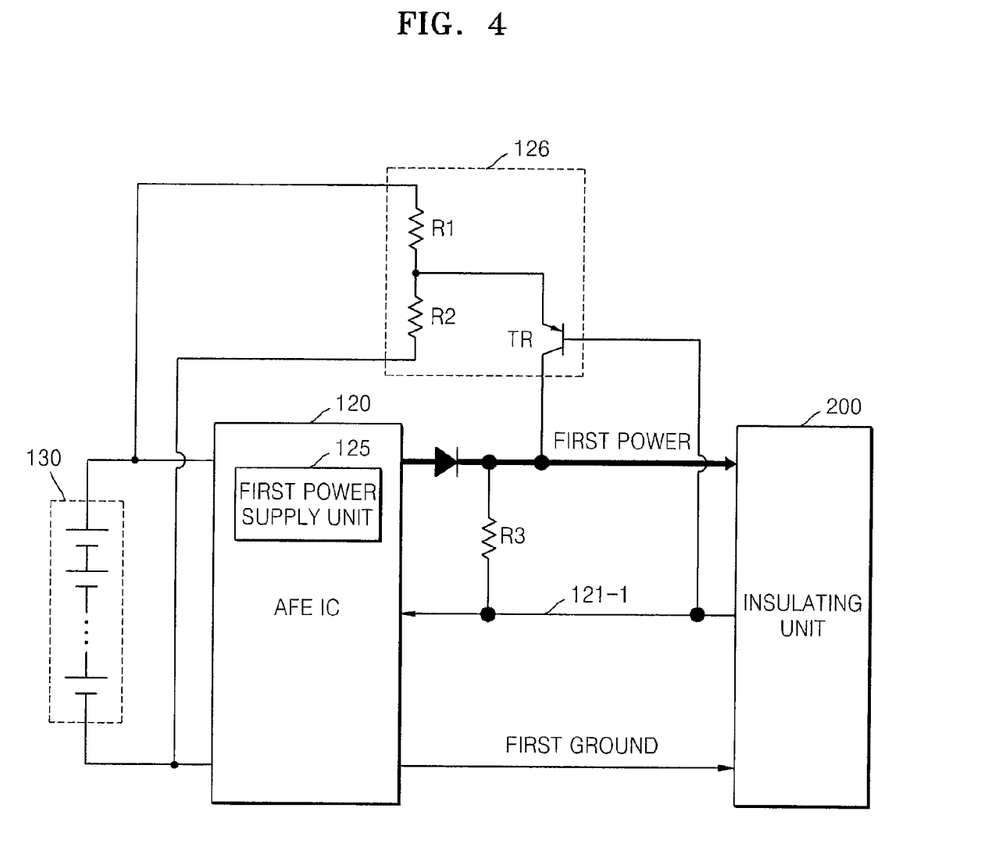
FIG. 4 is a circuit diagram for explaining a BMS according to another embodiment of the present invention.

FIG. 4 is a circuit diagram for explaining a BMS according to another embodiment of the present invention.

Referring to FIG. 4, the first power switching unit 126 includes a P-type transistor and resistors R1 and R2. A diode is coupled between the AFE IC 120 and the insulating unit 200, and a resistor R3 is coupled between one terminal of the P-type transistor and the control signal line 121-1.

Operation of the BMS of FIG. 4 will be explained in more detail below. When the BMS operates in a normal mode, the microcomputer 110 outputs a power-saving control signal at a high level (e.g., a logic high level). The power-saving control signal at the high level is applied through the control signal line 121-1 by the insulating unit 200 to a gate electrode of the P-type transistor and the AFE IC 120. Accordingly, the P-type transistor is turned off, and first power output from the first power supply unit 125 of the AFE IC 120 is supplied through the diode to the insulating unit 200.

If the BMS is in a power-saving mode, that is, the BMS is in a power-down or shut-down state, the microcomputer 110 outputs a power-saving control signal at a low level (e.g., a logic low level). The power-saving control signal at the low level is applied through the control signal line 121-1 by the insulating unit 200 to the gate electrode of the P-type transistor and the AFE IC 120. Accordingly, the P-type transistor is turned on, and the AFE IC 120 is changed to the power-saving mode and turns off the first power supply unit 125. As the P-type transistor is turned on, a voltage of the battery cell 130 is distributed to (e.g., voltage divided by) the resistors R1 and R2. Accordingly, power of the battery cell 130 is supplied to the insulating unit 200. Here, resistance values of the resistors R1 and R2 may be adjusted according to the voltage of the battery cell 130. If the power of the battery cell 130 is supplied to the insulating unit 200 through the first power switching unit 126, a reverse current may be prevented by the diode. Also, in FIG. 4, a capacitor may be added in order to synchronize an on-off time of the first power supply unit 125 of the AFE IC 120 with an on-off time of the P-type transistor.

Also, if a power-saving control signal applied through the control signal line 121-1 has a high level, the resistor R3 functions as a pull-up resistor for stably applying power from the first power supply unit 125 to the insulating unit 200 even when the P-type transistor is turned off.

Although the first power switching unit 126 includes the P-type transistor in FIG. 4, the present invention is not limited thereto, and an N-type transistor may be used, and a signal level of the power-saving control signal may be accordingly changed between a high level and a low level.

Figure 5:
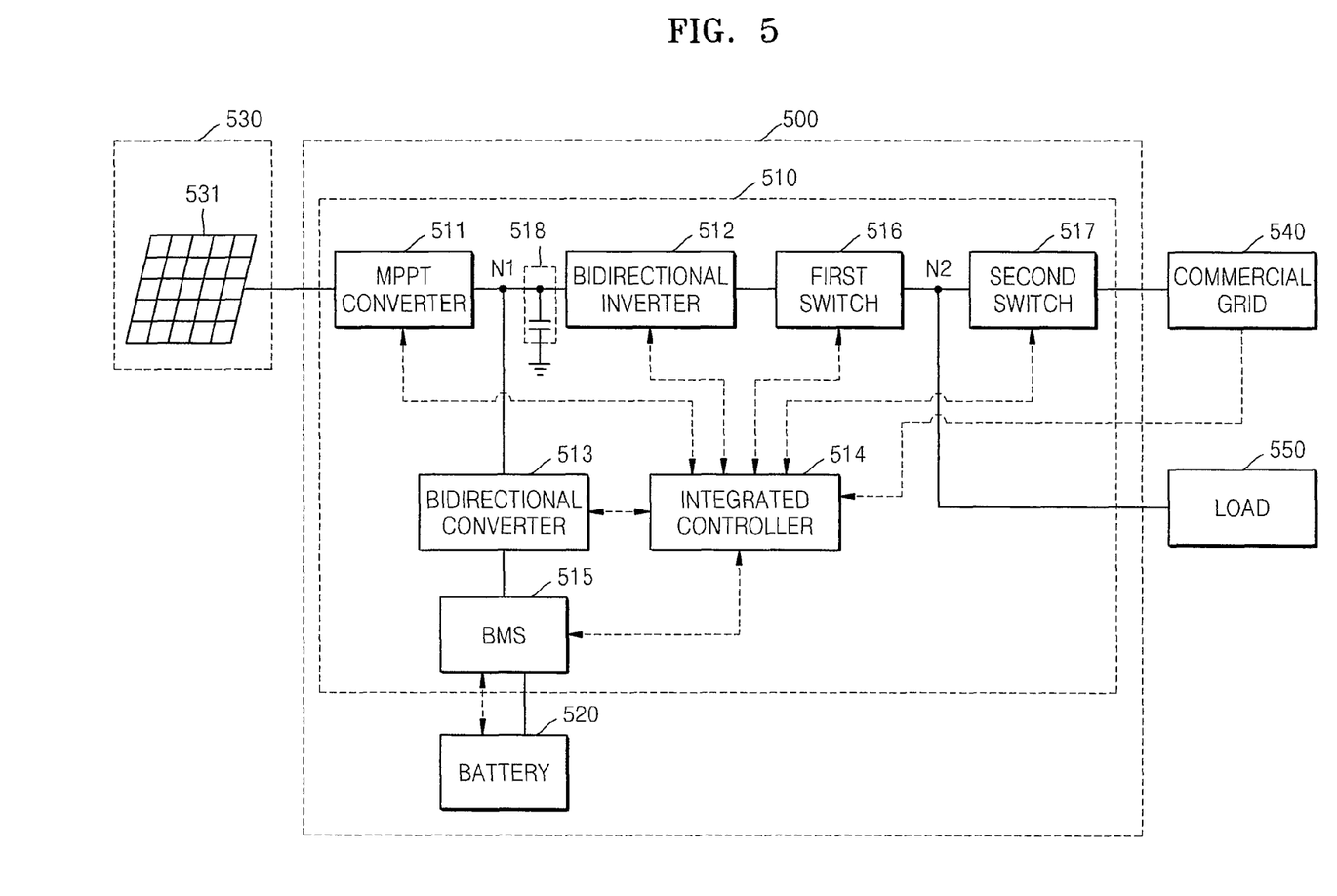
FIG. 5 is a schematic view for explaining a BMS according to an embodiment of the present invention.

FIG. 5 is a schematic view for explaining an energy storage system 500 including a BMS 515, according to an embodiment of the present invention. The BMS 515 may be the BMS described in reference to FIG. 3 or FIG. 4. Here, in a power-saving mode, power stored in a battery 520 is supplied through a power switching unit to an isolator for insulating the communication between a microcomputer and an AFE IC of the BMS 515. The structure of the energy storage system 500 will now be explained in more detail.

Referring to FIG. 5, a power management system 510 includes a maximum power point tracking (MPPT) converter 511, a bidirectional inverter 512, a bidirectional converter 513, an integrated controller 514, the BMS 515, a first switch 516, a second switch 517, and a DC link unit 518. The power management system 510 is coupled to the battery 520, a photovoltaic power (PV) generation system 530 including solar cells 531, a grid 540, and a load 550. Although the energy storage system 500, which is a grid-connected energy storage system, includes the power management system 510 and the battery 520 in FIG. 5, the present invention is not limited thereto, and the energy storage system 500 may be a power management system or a grid-connected energy storage system in which the power management system 510 and the battery 520 are integrated together.

The PV power generation system 530 generates electrical energy and outputs the electrical energy to the power management system 510. Although the PV power generation system 530 including the solar cells 531 is illustrated in FIG. 5, the PV power generation system 530 may be replaced by a wind power generation system or a tidal power generation system. In other embodiments, the PV power generation system 530 may be any suitable power generation systems that generate electrical energy by using renewable energy such as solar heat or geothermal heat. In one embodiment, the solar cells 531 for generating electrical energy by using sunlight may be installed on a house or a factory, and thus, are suitable to be applied in the energy storage system 500 of a house.

The grid 540 may include a power plant, a substation, power transmission cables, and the like. In a normal state, the grid 540 supplies power to the battery 520 or the load 550 according to whether the first switch 516 and the second switch 517 are turned on or off, and receives power supplied from the PV power generation system 530 or the battery 520. If the grid 540 is in an abnormal state, for example, due to a blackout, work being done on the grid 540, or the like, power supplied from the grid 540 to the battery 520 or the load 550 is stopped, and power supplied from the PV power generation system 530 or the battery 520 to the grid 540 is also stopped.

The load 550 consumes power generated by the PV power generation system 530, power stored in the battery 520, and/ or power supplied, from the grid 540, and may represent the load of a house, a factory, or the like.

Since the MPPT converter 511 converts a DC voltage output from the solar cells 531 into a DC voltage of a first node N1, and the output of the solar cells 531 vary according to a load condition and a climate change in insolation and temperature, the MPPT converter 511 controls the solar cells 531 to generate maximum power. That is, the MPPT converter 511 functions as a DC-DC converter by boosting a DC voltage output from the solar cells 531 and also as an MPPT controller. In one embodiment, a range of the DC voltage output from the MPPT converter 511 may be from about 300 V to about 600 V. Also, the MPPT converter 511 performs MPPT control for tracking a maximum power output voltage of the solar cells 531 according to a change in insolation, temperature, etc. In one embodiment, the MPPT control may include perturbation and observation (P&O) control, incremental conductance (IncCond) control, and power to voltage control. The P&O control involves increasing or decreasing a reference voltage by measuring power and a voltage of the solar cells 531, the IncCond control involves comparing and controlling output conductance and incremental conductance of the solar cells 531, and the power to voltage control involves controlling a power to voltage gradient. However, the MPPT control is not limited thereto and may also include other suitable types of MPPT control.

The DC link unit 518 is coupled between ground and the first node N1, which is coupled to the bidirectional inverter 512. The DC link unit 518 maintains the DC voltage output from the MPPT converter 511 at a DC link voltage, for example, 380 V DC, and supplies the DC link voltage to the bidirectional inverter 512 or the bidirectional converter 513. In some embodiments, the DC link unit 518 may be an electrolytic capacitor, a polymer capacitor, or a multilayer ceramic capacitor (MLCC). The first node N1 may have an unstable voltage level due to a change in the DC voltage output from the solar cells 531, an instantaneous voltage sag of the grid 540, a peak load of the load 550, or the like. Accordingly, the DC link unit 518 provides a stable DC link voltage so as to normally operate the bidirectional converter 513 and the bidirectional inverter 512. Although the DC link unit 518 is separately shown from other elements in FIG. 5, the DC link unit 518 may be included in the bidirectional converter 513, the bidirectional inverter 512, or the MPPT converter 511.

The bidirectional inverter 512 is coupled between the first node N1 and the grid 540. The bidirectional inverter 512 converts a DC voltage output from the MPPT converter 511 or the bidirectional converter 513 into an alternating current (AC) voltage to be input to the grid 540 or the load 550, or converts an AC voltage supplied from the grid 540 into a DC voltage to be input to the first node N1. That is, the bidirectional inverter 512 functions as an inverter for converting a DC voltage into an AC voltage and also as a rectifier for converting an AC voltage into a DC voltage.

The bidirectional inverter 512 rectifies an AC voltage input from the grid 540 through the first switch 516 and the second switch 517 into a DC voltage to be stored in the battery 520, and converts a DC voltage output from the PV power generation system 530 or the battery 520 into an AC voltage to be input to the grid 540. In this case, the AC voltage output to the grid 540 has to satisfy a power quality standard of the grid 540, in one embodiment, has a power factor greater than 0.9 and a total harmonic distortion (THD) less than 5%. To this end, the bidirectional inverter 512 prevents generation of invalid power by synchronizing a phase of an output AC voltage with a phase of the grid 540, and controls the level of the AC voltage. In one embodiment, the bidirectional inverter 512 may include a filter for removing harmonics from the AC voltage output to the grid 540, and may perform functions such as voltage variation range restriction, power factor improvement, DC component removal, and transient phenomenon protection. The bidirectional inverter 512 of FIG. 5 functions as an inverter for converting DC power output from the power generation system 530 or the battery 520 into AC power to be supplied to the grid 540 or the load 550, and also as a rectifier for converting AC power supplied from the grid 540 into DC power to be supplied to the battery 520.

The bidirectional converter 513 is coupled between the first node N1 and the battery 520, and converts a DC voltage output from the first node N1 into a suitable DC voltage to charge the battery 520. Also, the bidirectional converter 513 converts a DC voltage output of the battery 520 into a suitable DC voltage to be transmitted to the first node N1. For example, if DC power generated by the PV power generation system 530 or AC power supplied from the grid 540 is supplied to the battery 520, that is, if the power management system 510 is in a battery charging mode, the bidirectional converter 513 functions as a converter for reducing a DC voltage level of the first node N1 or a DC link voltage level of the DC link unit 518, for example, 380 V DC, into a suitable voltage level to charge the battery 520, for example, 100 V DC. Also, if power stored in the battery 520 is supplied to the grid 540 or the load 550, that is, if the power management system 510 is in a battery discharging mode, the bidirectional converter 513 functions as a converter for increasing a voltage level output from the battery 520, for example, 100 V DC, into a DC voltage level of the first node N1 or a DC link voltage level of the DC link unit 518, for example, 380 V DC. The bidirectional converter 513 of FIG. 5 converts DC power generated by the PV power generation system 530 or DC power converted from AC power supplied from the grid 540 into DC power to be stored in the battery 520, and converts DC power stored in the battery 520 to be input to the bidirectional inverter 512 and then to be supplied to the grid 540 or the load 550.

The battery 520 stores power supplied from the PV power generation system 530 and/or the grid 540. The battery 520 may be configured in such a manner that a plurality of battery cells are coupled in series or in parallel to increase capacity and/or output, and charging or discharging of the battery 520 is controlled by the BMS 515 or the integrated controller 514. The battery 520 may be any of various suitable batteries, for example, a nickel-cadmium battery, a lead storage battery, a nickel metal hydride (NiMH) battery, a lithium-ion battery, and a lithium polymer battery. The number of battery cells constituting the battery 520 may be determined based on power capacity, design conditions, etc., required by the energy storage system 500.

The BMS 515 is coupled to the battery 520, and controls charging and discharging of the battery 520 under the control of the integrated controller 514. Discharge power from the battery 520 to the bidirectional converter 513 and charge power from the bidirectional converter 513 to the battery 520 are transmitted through the BMS 515. In some embodiments, the BMS 515 may perform overcharge protection, overdischarge protection, overcurrent protection, overheating protection, cell balancing, and the like, in order to protect the battery 520. To this end, the BMS 515 may calculate an SOC and an SOH of the battery 520 by detecting a voltage, a current, and a temperature of the battery 520, and thus may monitor a remaining power amount, a lifetime, and so on of the battery 520.

In one embodiment, the BMS 515 may include one or more sensors for detecting a voltage, a current, and a temperature of the battery 520, a microcomputer for determining overcharge, overdischarge, overcurrent, cell balancing, an SOC, and an SOH based on a result of the detection, and a protection circuit for performing overcharging and overdischarging prevention, fuse breaking (or fuse tripping), cooling, or the like based on a control signal of the microcomputer. Also, the BMS 515 controls charging or discharging of the battery 520 under the control of the integrated controller 514, and transmits state information about a charge power amount calculated by using state information of the battery 520, for example, the SOC, to the integrated controller 514. In FIG. 5, the BMS 515 may include an insulating unit for performing isolated communication between an AFE IC block for sensing state information of the battery 520 and a microcomputer block for controlling the AFE IC block. When the BMS 515 operates in a power-saving mode, or when the energy storage system 500 operates in a power-saving mode, functional blocks of the AFE IC may be turned off to stop power supply to the insulating unit, and thus, power stored in the battery 520 may be supplied to the insulating unit through a power switching unit that is turned on according to a power-saving control signal.

The first switch 516 is coupled between the bidirectional inverter 512 and a second node N2. The second switch 517 is coupled between the second node N2 and the grid 540. The first switch 516 and the second switch 517 may be turned on or off under the control of the integrated controller 514. The first switch 516 and the second switch 517 supply or block power from the PV power generation system 530 or the battery 520 to the grid 540 or the load 550, or supply or block power from the grid 540 to the load 150 or the battery 520. For example, if power generated by the PV power generation system 530 or power stored in the battery 520 is to be supplied to the grid 540, the integrated controller 514 turns on the first and second switches 516 and 517, and if power is to be supplied to only the load 550, the integrated controller 514 turns on the first switch 516 and turns off the second switch 517. Also, if power of the grid 540 is to be supplied to only the load 150, the integrated controller 514 turns off the first switch 516 and turns on the second switch 517.

If the grid 540 operates abnormally, for example, in a blackout or during repairing of a power cable, the second switch 517 blocks power supply to the grid 540 under the control of the integrated controller 514, so that only the energy storage system 500 operates (hereinafter, referred to as a sole operation). In this case, the integrated controller 514 prevents a short-distance access accident, such as an electric shock on a cable maintenance or repair man accessing the grid 540, or a negative influence of the grid 540 on electrical equipment, by separating the power management system 510 from the grid 540. Also, if the grid 540 has recovered from the abnormal operation while power generated by the PV power generation system 530 or power stored in the battery 520 is supplied to the load 550 in the sole operation, a phase difference may occur between a voltage output from the grid 540 and a voltage output from the battery 520, and thus, the power management system 510 may be damaged. Accordingly, in order to solve this problem, the integrated controller 514 is configured to handle the sole operation.

The integrated controller 514 controls the overall operation of the power management system 510 or the energy storage system 500.

Figure 6:
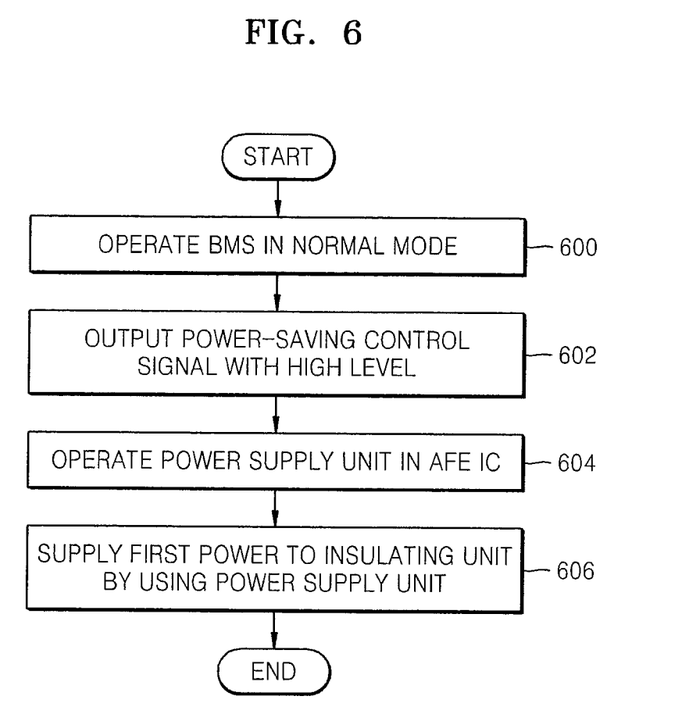
FIG. 6 is a flowchart illustrating a method of controlling a BMS, according to an embodiment of the present invention.

FIG. 6 is a flowchart illustrating a method of controlling a BMS, according to an embodiment of the present invention.

Referring to FIG. 6, in operation 600, the BMS operates in a normal mode. In operation 602, a power-saving control signal at a high level is output from a microcomputer. Here, the power-saving control signal at the high level is input to an AFE IC through an insulating unit. In operation 604, a power supply unit inside the AFE IC is operated. In operation 606, the power supply unit supplies first power to the insulating unit. The AFE IC and the microcomputer are insulated from each other, and the microcomputer supplies second power to the insulating unit.

Figure 7:
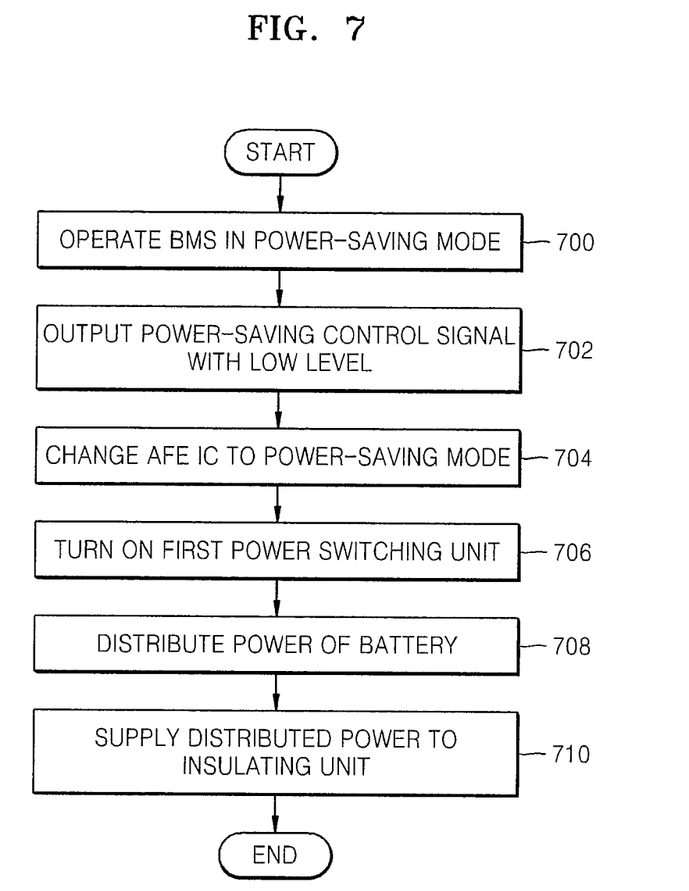
FIG. 7 is a flowchart illustrating a method of controlling a BMS, according to another embodiment of the present invention.

FIG. 7 is a flowchart illustrating a method of controlling a BMS, according to another embodiment of the present invention.

Referring to FIG. 7, in operation 700, the BMS operates in a power-saving mode. In operation 702, a microcomputer outputs a power-saving control signal at a low level. The power-saving control signal at the low level is applied to a first power switching unit and an AFE IC through an insulating unit. In operation 704, the AFE IC is changed to the power-saving mode according to the power-saving control signal at the low level to turn off a power supply unit inside the AFE IC. In operation 706, the first power switching unit is turned on according to the power-saving control signal at the low level. In operation 708, power of a battery is distributed through the first power switching unit. In operation 710, the distributed power is supplied to the insulating unit.

As described above, according to one or more of the above embodiments of the present invention, a BMS may reduce costs by stably supplying power to an insulating unit in a power-saving mode even when an isolator has no built-in DC-DC converter.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A battery management system comprising:
   a battery cell;
   an analog front end coupled to a first ground;
   a computer coupled to a second ground;
   an insulating unit for insulating the analog front end from the computer; and
   a first power switching unit for receiving a control signal from the computer through the insulating unit, controlling a distribution of power from the battery cell according to the control signal, and controlling a supply of the power to the insulating unit, wherein the first power switching unit comprises:
     a transistor configured to be turned on or off according to the control signal;
     a first resistor and a second resistor coupled to a first terminal of the transistor for distributing a voltage of the battery cell; and
   wherein the battery management system further comprises a third resistor coupled between a second terminal of the transistor and an output terminal of the insulating unit through which the control signal is output.

2. The battery management system of claim 1, wherein the analog front end is configured to receive the control signal corresponding to a power-saving mode from the computer through the insulating unit, and turn off a first power supply unit of the analog front end.

3. The battery management system of claim 2, further comprising a diode coupled between the first power supply unit and the insulating unit.

4. The battery management system of claim 1, wherein:
   in response to receiving the control signal corresponding to a power-saving mode from the computer, the insulating unit is configured to output the control signal to the analog front end and the first power switching unit,
   in response to receiving the control signal, the analog front end is configured to turn off the first power supply unit in the analog front end, and
   in response to receiving the control signal, the first power switching unit is configured to turn on to supply power of the battery cell distributed through the first resistor and the second resistor to the insulating unit.

5. The battery management system of claim 4, wherein the power-saving mode comprises a power-down mode or a shut-down mode.

6. The battery management system of claim 1, wherein:
   in response to receiving the control signal corresponding to a normal mode from the computer, the insulating unit is configured to output the control signal to the analog front end and the first power switching unit,
   in response to receiving the control signal, the analog front end is configured to turn on the first power supply unit in the analog front end, and supply first power to the insulating unit through the first power supply unit, and
   in response to receiving the control signal, the first power switching unit is configured to turn off to stop supply of power of the battery cell to the insulating unit.

7. The battery management system of claim 4, wherein the analog front end is configured to change to the power-saving mode according to the control signal.

8. The battery management system of claim 1, wherein the insulating unit is configured to receive first power from the analog front end, and receive second power from the computer.

* * * * *